United States Patent
Parameswaran

(10) Patent No.: US 8,004,312 B2
(45) Date of Patent: Aug. 23, 2011

(54) FAIL SAFE I/O DRIVER WITH PAD FEEDBACK SLEW RATE CONTROL

(75) Inventor: Pramod Elamannu Parameswaran, Bangalore (IN)

(73) Assignee: LSI Corporation, Milpitas, CA (US)

( * ) Notice: Subject to any disclaimer, the term of this patent is extended or adjusted under 35 U.S.C. 154(b) by 178 days.

(21) Appl. No.: 12/353,971

(22) Filed: Jan. 15, 2009

(65) Prior Publication Data

US 2010/0176842 A1 Jul. 15, 2010

(51) Int. Cl.
*H03K 19/094* (2006.01)
(52) U.S. Cl. .......................................... 326/83; 326/27
(58) Field of Classification Search ............... 326/26, 326/27, 80–87
See application file for complete search history.

(56) References Cited

U.S. PATENT DOCUMENTS

| | | | | |
|---|---|---|---|---|
| 5,646,550 A | * | 7/1997 | Campbell et al. | 326/81 |
| 5,880,602 A | * | 3/1999 | Kaminaga et al. | 326/81 |
| 6,859,074 B2 | * | 2/2005 | Ajit | 327/108 |

* cited by examiner

*Primary Examiner* — Don P Le
(74) *Attorney, Agent, or Firm* — Raj Abhyanker, P.C.

(57) ABSTRACT

Disclosed are a method, system and apparatus for an improved fail safe I/O driver with pad feedback slew rate control are disclosed. In one embodiment, a pad driver circuit includes a pad node, an NMOS component, a feedback capacitor between the pad node and a gate of the NMOS component to control slew rate across a range of capacitor loads, a switch circuit between the pad node and the feedback capacitor, and a signal generator to generate a signal to control the switch circuit. The switch circuit to maintain a main driver circuit and a pre-driver circuit of the pad driver circuit in a fail safe state when an integrated circuit that includes the pad driver circuit is in the fail safe state. The pad driver circuit may include a PMOS component.

29 Claims, 5 Drawing Sheets

FAIL SAFE I/O DRIVER WITH PAD FEEDBACK SLEW RATE CONTROL

FIELD OF TECHNOLOGY

This disclosure relates generally to a technical field of hardware technology involving an integrated circuit that includes an improved fail safe I/O driver with pad feedback slew rate control.

BACKGROUND

A pad driver circuit may be a part of an integrated circuit which interfaces a chip core (e.g., IC core) with an external world. The pad driver circuit may have to drive a load which has a capacitive range under a slew rate control condition. A slew rate may be a maximum rate of change of a signal at any point in a circuit. Under the slew rate control condition (e.g., where the pad driver circuit needs to drive a wider capacitive load), the pad driver may need a pad feedback (e.g., Miller feedback) to control the slew rate.

However, the deployment of the pad feedback may force conduction of an NMOS component in the pad driver circuit. Conduction of the NMOS component may not be favorable since conduction of the NMOS component at a fail safe state of the integrated circuit may cause current to be drawn from a pad node which in turn causes a drop of voltage at a communication line where the pad driver is connected. This drop in voltage at the communication line may hamper communication and/or input to an other device (e.g., an other IC, etc.) that is connected to the communication line.

SUMMARY

Disclosed are a method, system and apparatus for an improved fail safe I/O driver with pad feedback slew rate control. In one aspect, a pad driver circuit is described. The pad driver circuit includes a pad node and an NMOS component. A feedback capacitor is located between the pad node and a gate of the NMOS component to control slew rate across a range of capacitor loads. The pad driver circuit includes a switch circuit between the pad node and the feedback capacitor. In addition, the pad driver circuit includes a signal generator to generate a signal to control the switch circuit. The switch circuit maintains a main driver circuit and a pre-driver circuit of the pad driver circuit in a non-conduction state when an integrated circuit that includes the pad driver circuit is in the fail safe state.

In another aspect, a method of a pad driver circuit is described. The method of a pad driver circuit includes controlling slew rate across a range of capacitor loads. The method also includes generating a signal to control a switch circuit to maintain a main driver circuit and a pre-driver circuit of the pad driver circuit in a fail safe state when an integrated circuit that includes the pad driver circuit is in the fail safe state.

In yet another aspect, an integrated circuit is described. The integrated circuit includes a main logic circuitry and a pad driver circuitry. The pad driver circuitry is coupled to the main logic circuitry to prevent a flow of a pad node signal to an NMOS component of a main driver circuit and a pre-driver circuit of the pad driver circuit when the integrated circuit that includes the main driver circuit and the pre-driver circuit is in a fail safe state. This is achieved through a generation of a signal which controls a switch circuit of the pad driver circuitry.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE VIEW OF FIGURES

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Disclosed are a method, system and apparatus for an improved fail safe I/O driver with pad feedback slew rate control are disclosed. Although the present embodiments have been described with reference to specific example embodiments, it will be evident that various modifications and changes may be made to these embodiments without departing from the broader spirit and scope of the various embodiments.

Figure 1:
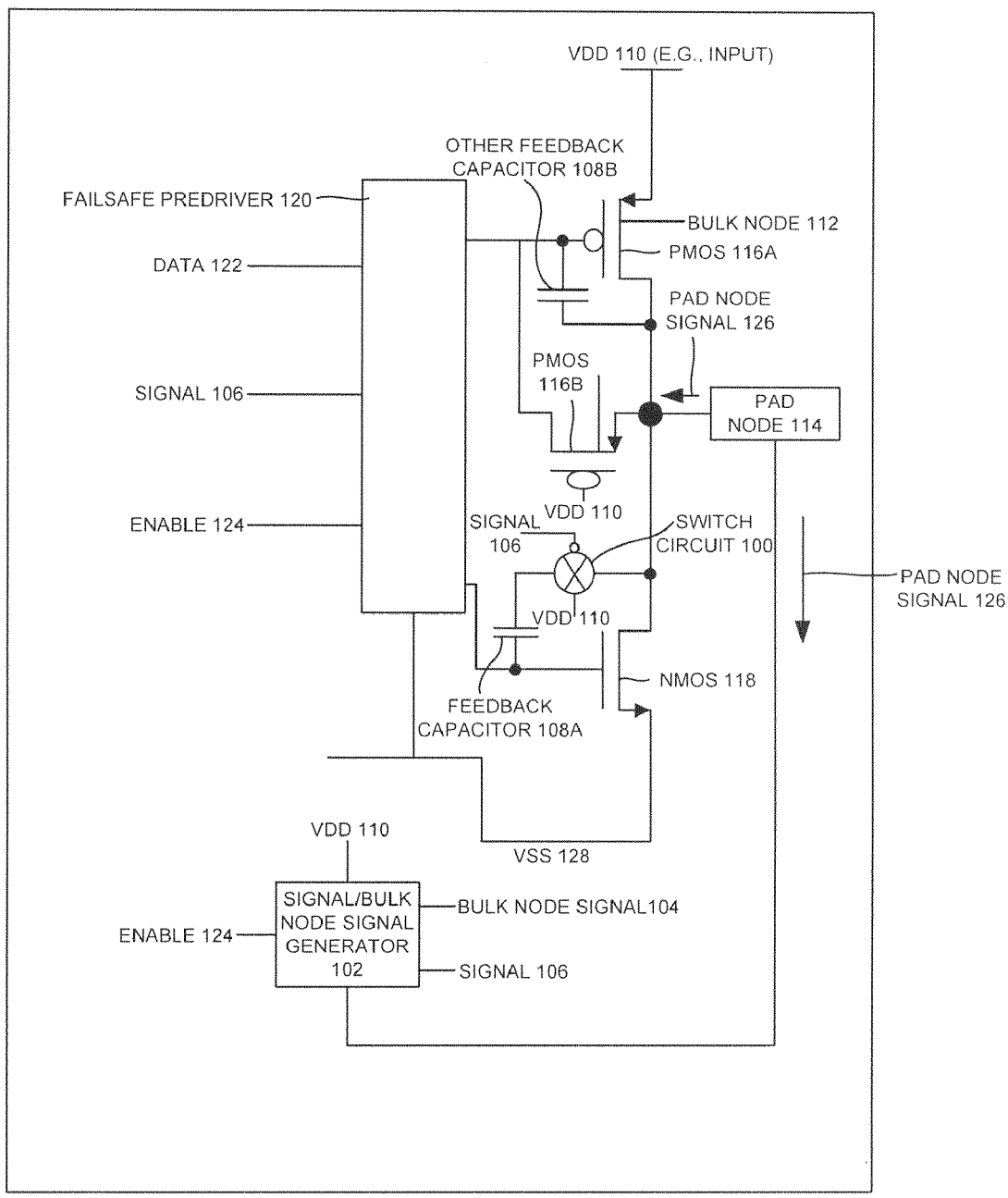
FIG. 1 is a system view of an improvised pad driver circuit illustrating a fail safe driver with a slew rate control, according to one embodiment.

FIG. 1 is a system view of a pad driver circuit illustrating a fail safe driver with a slew rate control, according to one embodiment. Particularly, FIG. 1 illustrates a switch circuit 100, a signal/bulk node signal generator 102, a bulk node signal 104, a signal 106, a feedback capacitor 108A, an other feedback capacitor 108B, Vdd (e.g., an input) 110, a bulk node 112, a pad node 114, the PMOS component 116A, the PMOS component 116B, the NMOS component 118, a pre-driver circuit 120, a data signal 122, an enable signal 124, a pad node signal 126, a Vss 128, and a pad driver circuit 130, according to one embodiment.

The switch circuit 100 may be used to keep up the main driver circuit 202 and a pre-driver circuit 120 of a pad driver circuit 130 in a power down state. The switch circuit 100 may be constructed using any components that are preferred by the designer of the integrated circuit. The signal/bulk node signal generator 102 may generate the bulk node signal 104 to maintain the bulk node 112 of the PMOS components of the main driver circuit 202 and the pre-driver circuit 120 in a high potential (e.g., may be in the power down state). The bulk node signal 104 may be generated through the signal/bulk node signal generator 102 that may maintain the bulk node 112 of the PMOS component 116A of the main driver circuit 202 and the pre-driver circuit 120 of the pad driver circuit 130. The signal 106 may be an electric current or an electromagnetic field which may be used to convey the data from one place to another (e.g., may be input signal and/or output signal). The feedback capacitor 108A may be used to control the slew rate across a range of capacitor loads (e.g., may be between the pad node and the gate of the NMOS component). The other feedback capacitor 108B may be used to control the slew rate across a range of capacitor loads (e.g., may be between the gate of the PMOS component and the pad node). The Vdd 110 (e.g., an input) may be a voltage source which may supply voltage to transistors (e.g., PMOS and NMOS).

The bulk node 112 may be a node of a transistor is required to be kept in a higher potential of the pad node signal and the Vdd 110 signal to avoid forward bias of a drain/bulk junction of the PMOS transistors. The forward bias may be a condition in the transistor that enables the flow of current through the junction. The pad node 114 may be an interface of an Integrated Circuit (IC) with an external environment. The driver signal may drive external devices through the pad node 114 and the IC may receive signals from the external environment from this pad node 114. The PMOS component 116A may be a transistor which is a part of the main driver circuit that is required to drive an external device through the pad node 114.

The PMOS component 116B may be a transistor that is used to enable the PMOS component 116A gate track the pad node voltage. The PMOS component and the NMOS component may have four terminals a gate, a source, a drain and a bulk. The NMOS component 118 may be NMOS transistor that is a part of the main driver circuit that is required to drive an external device through the pad node 114. The pre-driver circuit 120 may be supporting driver circuit for the main driver circuit that is configured for the fail safe conditions. The data signal 122 may be a signal that has information for the external device. The enable signal 124 may be a signal that is required to enable the pre-driver circuit based on certain requirements (e.g., when there is outgoing signal from driver, incoming signal from external device, etc.). The pad node signal 126 may be a signal from the external devices (e.g., interfaces, etc.) through the pad node 114. The Vss 128 may be the ground terminal. The pad driver circuit 130 may be circuit that may be used to drive the external devices or get input from the external devices through the pad node 114.

The power supply to the integrated circuit may be down, and the interfaces or the devices connected to the integrated circuit may be active, since the components in the driver circuit may conduct leading to the loss of potential loss at the pad node. The fail safe design may be the design which ensures there is no loss of potential at the node because of the conduction of components in the driver circuit. The PMOS component 116A in the main driver circuit 202 may not conduct because of the introduction of the another PMOS component 116B between the pad node and the gate of the PMOS component 116A to maintain same potential between the pad node 114 and the gate of the PMOS component 116A.

During the slew rate control conditions (e.g., for controlling di/dt, SSO noise conditions, etc.) the feedback capacitor may 108A may enable conduction of the NMOS component 118 of the main driver circuit 202 which may sink some current from the pad node. The switch circuit 100 may be controlled by the signal 106 generated by the signal/bulk node signal generator 102. During the fail safe conditions the signal turns on the switch circuit 100 to block any unwanted incoming pad node signals. During the fail safe condition the circuits in the IC may be in non conduction state. Hence during the fail safe state there may be no supply to the NMOS component 118, hence there may be no conduction of the NMOS component 118 and therefore no loss of potential at the pad node 114.

In one embodiment, the feedback capacitor between the pad node 114 and the gate of the NMOS component 118 component may control slew rate across the range of capacitor loads. The switch circuit 100 may be between the pad node 114 and the feedback capacitor 108A. The signal generator 102 may generate the signal to control the switch circuit 100. The switch circuit 100 may maintain the main driver circuit 202 and the pre-driver circuit 120 of the pad driver circuit 130 in the non conduction state when the integrated circuit that may include the pad driver circuit is in the fail safe state.

Figure 2:
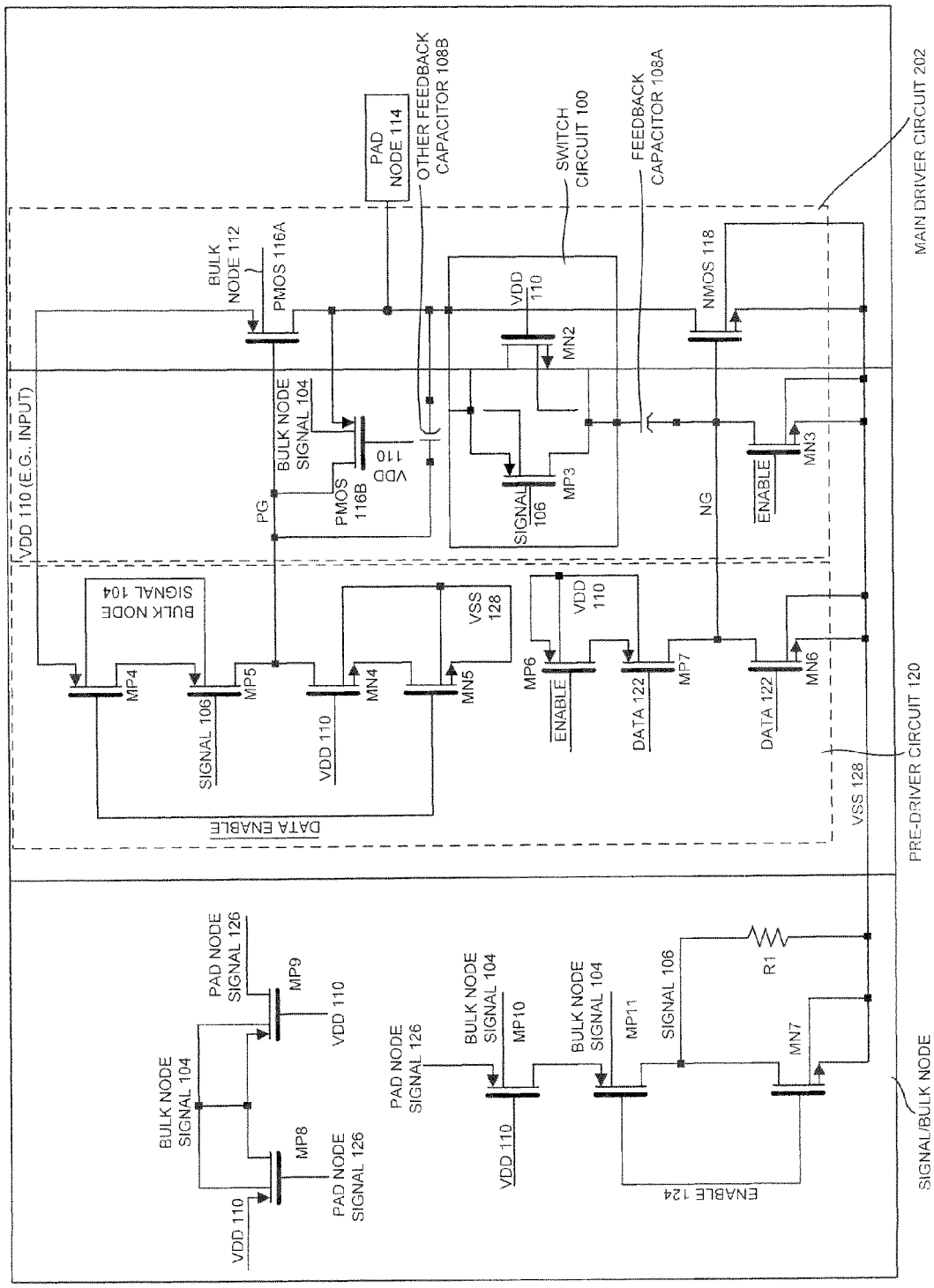
FIG. 2 is a systematic view illustrating a signal/bulk node signal generation, a pre-driver circuit, and a main driver circuit of the pad driver circuit, according to one embodiment.

The bulk node signal generator 102 may generate the bulk node signal 104 to maintain the bulk node 112 of the PMOS component 116A of the main driver circuit and bulk node of the PMOS component of the pre-driver circuit in the high potential to avoid possible forward bias current to flow from the pad node 114 to an input of the pad driver circuit 130 through the bulk node 112 of the PMOS component 116A of the main driver circuit 202 and through the bulk node of the PMOS component of the pre-driver circuit (e.g., pre-driver circuit illustrated in FIG. 2).

The other feedback capacitor 108B between the gate of the PMOS component 116A and the pad node 114 may control the slew rate across the range of capacitor loads. The capacitor load may have the range of 10 pF to 400 pF. The control component coupled to the PMOS component 118A may maintain the PMOS component 118A in a non conduction state to prevent flow of the pad node signal 126 into the core of the integrated circuit through the input of the pad driver circuit 130 when the integrated circuit that may include the pad driver circuit 140 is in the fail safe state. The control component may be the other PMOS component 116B.

The signal from the signal generator 102 may be low in the normal driver mode to permit the pre-driver circuit to function normally when an input to the pad driver circuit is high and when the enable signal to the signal generator 102 is high. The normal driver mode may be the mode where the IC will drive the external components through the communication line coupled to the pad driver circuit through the IC pins. The signal from the signal generator 102 is low in a normal receiver mode when an input to the pad driver circuit 130 is high and when an enable signal to the signal generator 102 is low. The normal receiver mode may be the mode where the IC will receive the signal from the communication line coupled to the pins of the IC. The signal from the signal generator 102 may be the same as the pad node signal 126 to prevent the pad node signal 126 arriving at an input of the pad driver circuit 130 through the pre-driver circuit 120 in a fail safe mode when an enable signal and an input to the signal generator 102 is low.

The slew rate may be controlled across the range of capacitor loads. The signal 106 may be generated to control the switch circuit 100 to maintain the main driver circuit 202 and/or the pre-driver circuit 120 of the pad driver circuit 130 in the power down state when the integrated circuit that may include the pad driver circuit 130 is in the power down state. The bulk node signal 104 may be generated to maintain the bulk node 112 of the PMOS component 116A of the main driver circuit 202 and the bulk node of the PMOS component of the pre-driver circuit in high potential to avoid possible forward bias current to flow from the pad node to the input of the pad driver circuit in a fail safe state.

The flow of the pad node signal 126 through the input 110 of the pad driver circuit 130 into the core of the integrated circuit may be prevented using the control component when the integrated circuit that includes the pad driver circuit 130 is in the fail safe state. The control component may be the other PMOS component. The pad driver circuitry 130 coupled to the main logic circuitry may prevent the flow of the pad node signal 126 to an NMOS component of the main driver circuit 202 and a pre-driver circuit 120 of the pad driver circuit 130 when the integrated circuit that includes the main driver circuit 202 and the pre-driver circuit 120 in a fail safe state through a generation of the signal 106 which controls the switch circuit 100 of the pad driver circuitry 130.

The switch circuit 100 may control the flow of the pad node signal 126 from the pad node 114 of the pad driver circuitry 130 to the gate of the NMOS component 118 of the pad driver circuitry. The switch circuit 100 may be located between the gate of the NMOS component 118 and the pad node 114 of the pad driver circuit 130. The signal 106 to control the switch circuit 100 may be generated by the signal generator 102 based on input to the pad driver circuitry and/or the pad node signal.

FIG. 2 is a schematic view illustrating a signal/bulk node signal generation, a pre-driver circuit, and a main driver circuit of the pad driver circuit, according to one embodiment. Particularly, FIG. 2 illustrates the switch circuit 100, the signal/bulk node signal generator 102, the bulk node signal 104, the PMOS component 116A, the PMOS component 116B, the NMOS component 118, the pre-driver circuit 120, and a main driver circuit 202, according to one embodiment.

The main driver circuit 202 of the pad driver circuit 130 may drive the external device through the pad node 114. The main driver circuit may be an interface between the IC pins and the core of the integrated circuit.

In an example embodiment, FIG. 2 may illustrate circuit blocks such as the signal/bulk node signal generator 102, the pre-driver circuit 120 and the main driver circuit 202. The signal/bulk node signal generator 102 may check the pad node 114 and the input to the IC to generate the signal 106 and/or the bulk node signal 104. Based on the Vdd 110 and the pad node signal 126 the bulk node of the PMOS components may receive higher potential signal (e.g., the bulk node signal 104) from the signal/bulk node signal generator 102. The PMOS components MP8 and MP9 of the bulk node signal generator may generate the required bulk node signal 104. The PMOS bulk node 112 may be provided the bulk node signal (e.g., the higher potential) to avoid possible forward bias current to flow to the Vdd 110. In the normal driver mode the signal from the signal generator 102 may be low allowing the pre-driver circuit 120 to function normally.

In output mode, enable signal may be equal to Vdd, forcing the NMOS component MN7 to pull the signal 106 low. In an input mode, the enable signal may be low, and if the Vdd 110 is available, the signal 106 may be low (e.g., as the resistor R1 which may pull down the signal 106 to low) as the integrated circuit may not be in fail safe condition. The resistor R1 may be made sufficiently big to reduce the pad current during the Vdd 110 ramp up based on requirements. The resistor R1 may also be built using of series of NMOS components.

In fail safe mode, the enable signal may be low, the Vdd 110 may also be low (e.g., the device may be powered down), and the PMOS components MP10 and MP11 may maintain the signal 106 to track the pad node signal 126. This condition may prevent any current from the pad node 114 to the Vdd 110 through the pre-driver circuit 120 (e.g., the PMOS components MP4, MP5 in the pre-driver circuit 120) as the PMOS component MP4 will be OFF. The pre-driver block (e.g., the pre-driver circuit 120) may drive the main driver circuit devices (e.g., through the NG, PG nodes as illustrated in FIG. 2). The pre-driver circuit 120 may take combined data and the enable signal as inputs with the Vdd 110 as the power.

The nodes PG and NG (e.g., as illustrated in FIG. 2) can be low when the main driver circuit 202 may be driving the pad node 114 high. The PG/NG nodes may have the potential of the Vdd 110 when it may be driving the pad node 114 low. The components MP5 (e.g., PMOS component) and MN5 (e.g., NMOS component) may generate potentials at the node PG. The components MP6, MN6 (e.g., PMOS component) and MN3 (e.g., NMOS component) may generate potentials at the node NG. The PMOS component 116B may be used for protecting the node PG having some defined state during power down. The PMOS component 116B may have its gate tied to the Vdd 110 which makes sure that node PG tracks the pad node voltage when the Vdd 110 is down.

The other components MP5 (e.g., PMOS component) and MN4 (e.g., NMOS component) may be used for fail safe protection. The PMOS component MP5 may have its gate at the signal 106 to prevent any current feed to the node PG from pad node 114 through the PMOS component 116B reaching the Vdd 110. The NMOS component MN4 may have its gate connected to the Vdd 110. The NMOS component MN4 may be off when power is down.

The fail safe driver (e.g., the main driver circuit 202) with slew control driver may include the PMOS component 116A and the NMOS component 118 respectively. The pad driver circuit 130 may have slew rate control using the Miller capacitors (e.g., the feedback capacitors 108A-B) for providing miller feedback which offers better output slew rate control with wide range of the pad node output capacitance load. The pad driver circuit 130 may incorporate MN2 (e.g., NMOS component) and MP3 (e.g., PMOS component) in series with the feedback capacitor 108A. The NMOS component MN2 may have its gate coupled to the Vdd 110 and the PMOS component MP3 may have the signal 106 at its gate node. Since during device powered down situation the Vdd 110 may be low, the signal 106 may track the pad node 114 and there may not be any signal coupling on to the node NG from the pad node 114.

Figure 3:
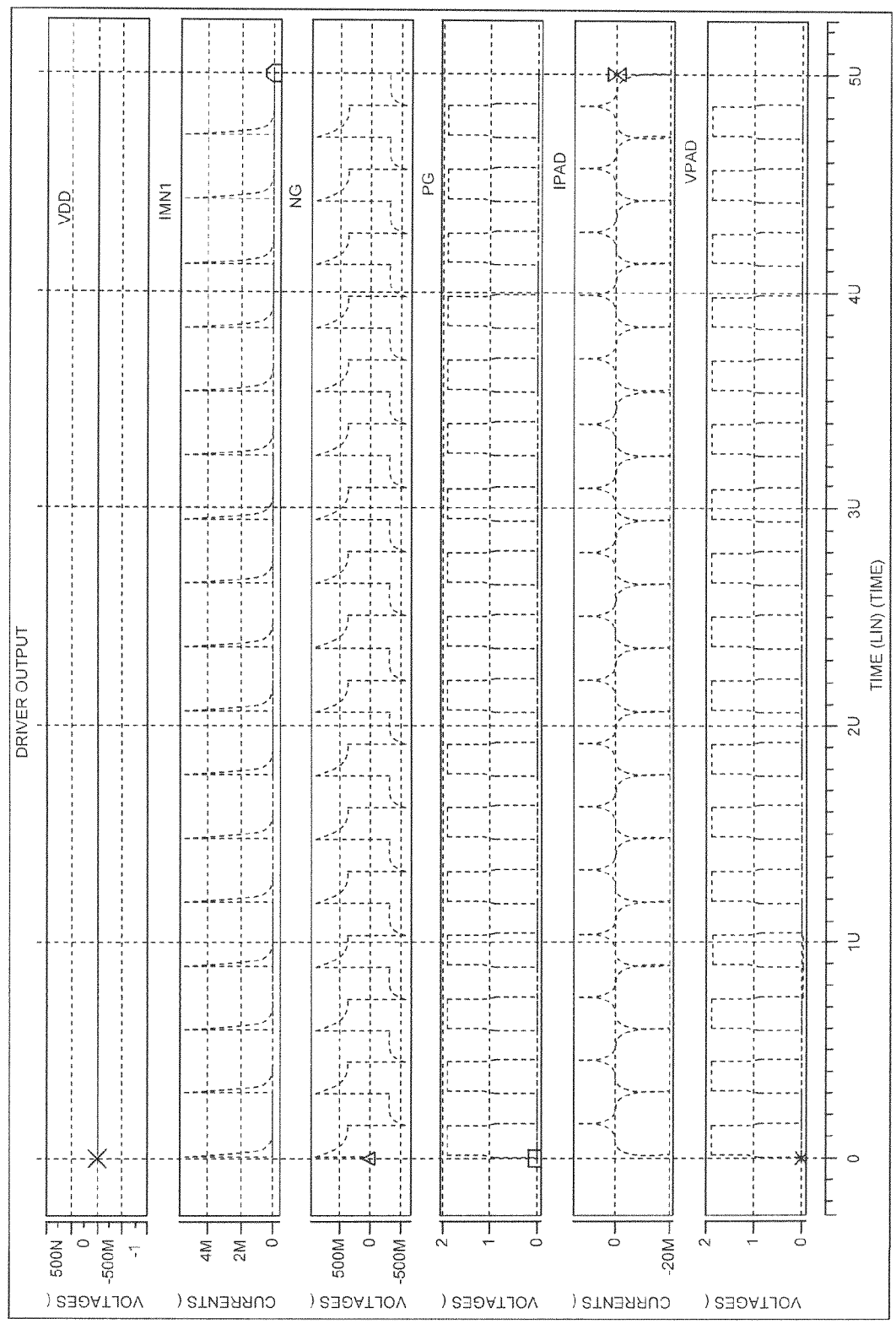
FIGS. 3 and 4 is a diagrammatic view illustrating a difference between the existing prior art and a proposed of an output waveforms for the pad drivers, according to one embodiment.
Figure 4:
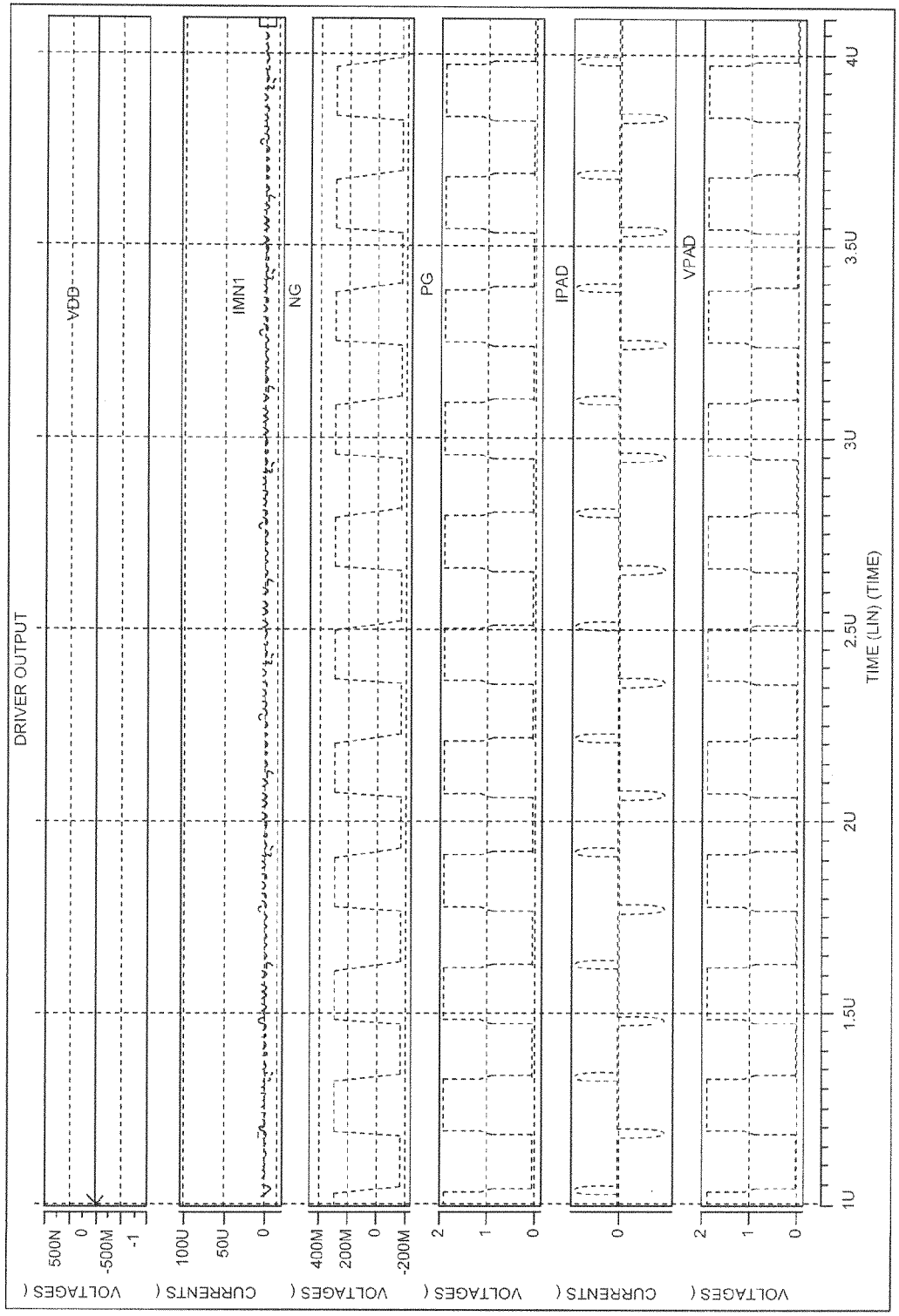

FIGS. 3 and 4 is a diagrammatic view illustrating a difference between the existing prior art and a proposed of an output waveforms for the pad drivers, according to one embodiment.

In example embodiment, FIG. 3 may illustrate the output waveforms for drivers which may be for the existing prior art, and here the current (e.g., the pad node current) through the NMOS component MN1 as it may be turned on (e.g., the potential at NG may be above Vt, where Vt may be a threshold voltage), and it may be in milli amperes range. Where as FIG. 4 may illustrate for proposed waveforms for drivers in which NG may be low (e.g., the potential at NG may be below Vt) and IMN1 (e.g., current through MN1) may be significantly less in nano amperes. Hence the FIG. 4 shows the improvement of reduction of the pad node signal 126 (e.g., IMN1) at the NMOS component 118. In FIG. 3, the IMN1 302 illustrates the waveform before implementation of the improvised fail safe driver. In FIG. 4, the IMN1 402 illustrates the depleted waveform after implementation of the improvised fail safe driver.

Figure 5:
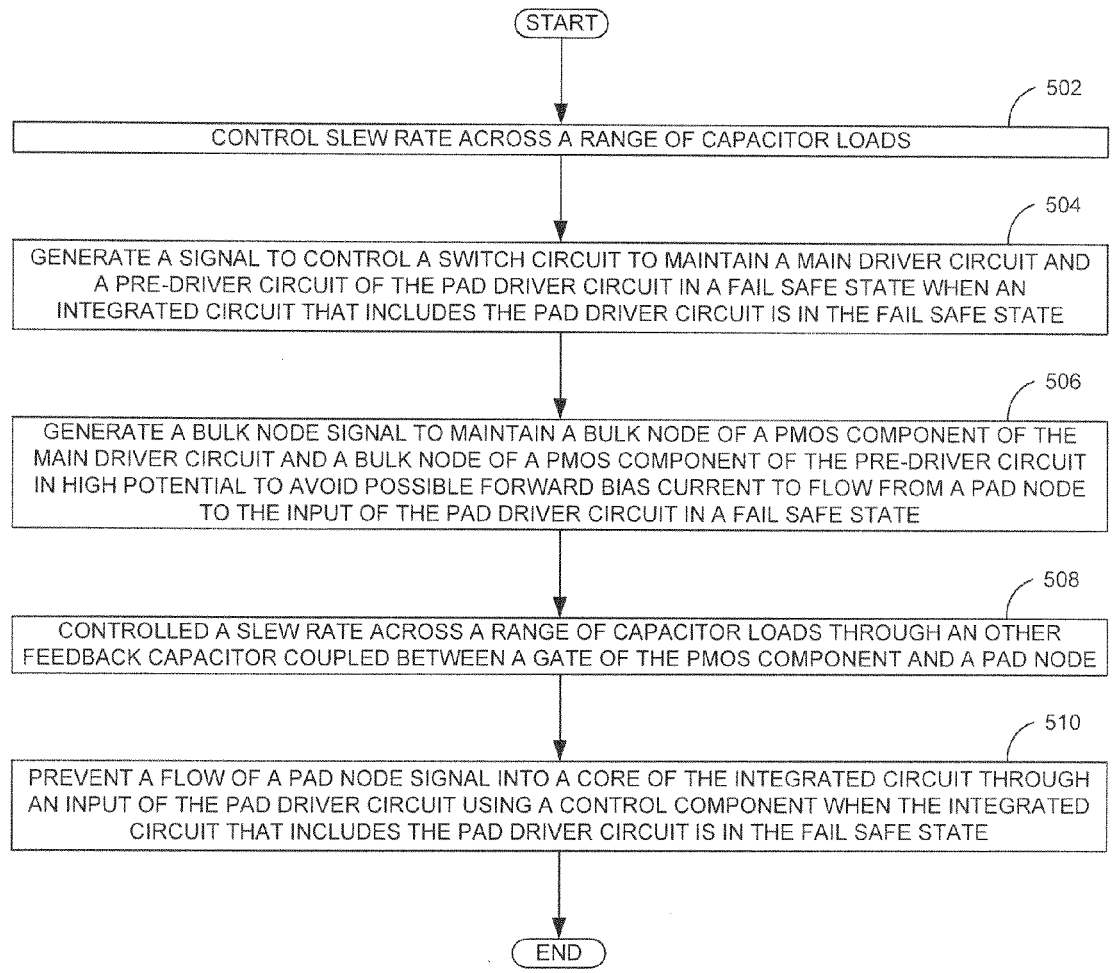
FIG. 5 is a process flow of a controlling a slew rate across a range of capacitor loads, according to one embodiment.

FIG. 5 is a process flow of a controlling a slew rate across a range of capacitor loads, according to one embodiment. In operation 502, a slew rate may be controlled across a range of capacitor loads. In operation 504, a signal may be generated to control a switch circuit to maintain a main driver circuit and/or a pre-driver circuit of the pad driver circuit in a fail safe state when an integrated circuit that may include the pad driver circuit is in the fail safe state.

In operation 506, a bulk node signal may be generated to maintain a bulk node of a PMOS component of the main driver circuit and/or a bulk node of a PMOS component of the pre-driver circuit in high potential to avoid possible forward bias current to flow from a pad node to the input of the pad driver circuit in a fail safe state. In operation 508, a slew rate may be controlled across a range of capacitor loads through an other feedback capacitor coupled between a gate of the PMOS component and/or a pad node. The capacitor load may have a range of 10 pF to 400 pF.

In operation 510, a flow of a pad node signal into a core of the integrated circuit may be prevented through an input of the pad driver circuit using a control component when the integrated circuit that includes the pad driver circuit is in the fail safe state. The core of the integrated circuit may be the internal main logical circuitry that may perform a specific task for which it has been designed. The control component may be an other PMOS component. The signal from a signal generator 102 may be low in a normal driver mode to permit the pre-driver circuit to function normally when an input to the pad driver circuit may be high. The signal from the signal generator may be low in a normal receiver mode when an input to the pad driver circuit is high and when an enable signal to the signal generator is low. The signal from the signal generator is same as the pad node signal to prevent a pad node signal arriving at an input of the pad driver circuit through the pre-driver circuit in a fail safe mode when an enable signal to the signal generator is low.

In an embodiment, the integrated circuit may be designed to control slew for wide range of capacitive loads. The design may include implementation of a feedback capacitor to control the slew rate. The fail safe condition may be the condition when the power supply is cut down to the integrated circuit and the integrated circuit is expected not to take any input from an active communication line for which the integrated circuit is coupled (e.g., connected).

The communication line may have signals that drive a wide range of capacitive loads. However, since the pins of the integrated circuit are conductive in nature, the signal may get into the integrated circuit causing a potential drop in the communication line. Hence, during the fail safe condition there may be a drop in voltage in the communication line because of the conduction of the NMOS components in the main driver circuit 202.

The NMOS component may conduct because of the feedback capacitor is attached to the gate. However, the introduction of the switch circuit 100 between the pad node and the feedback capacitor 108A may enable control of power flow from the pad node 114 to the NMOS component 118. The switch circuit 100 may be controlled by the signal/bulk node signal generator 102 based on state of the power provided to the integrated circuit. In addition, there may be forward bias current flow from the pad node to an input of the pad driver circuit through the bulk node of the PMOS components. This forward bias current may damage the integrated circuit.

The signal/bulk node signal generator may generate a bulk node signal 104 to keep the bulk node of the PMOS components in high potential to avoid any forward bias current flow from the bulk node of the PMOS components to the input of the driver/pre-driver circuit. Hence the integrated circuit may less susceptible to damage in power down state and may not affect the process of communication in the communication line.

In an example embodiment, if a designer 'John' uses the IC which implements the switch circuit 100 for controlling the flow of power from the pad node 114 to the NMOS components there is likelihood that the IC has more lifetime. This is due to less chance of the IC getting damaged because of flow of power into the core of the IC during power down state. Hence the IC becomes less susceptible to being damaged during a power down state.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

Particularly, the switch circuit 100, the signal/bulk node signal generator 102, the PMOS component 116A, the PMOS component 116B, the NMOS component 118, the pre-driver circuit 120, the data signal 122, and an enable signal 124, the main driver circuit 202 of FIG. 1-5 may be enabled using software and/or using transistors, logic gates, and electrical circuits (e.g., application specific integrated ASIC circuitry) such as a signal/bulk node signal generator circuit, a fail safe pre-driver circuit, a data signal circuit, and an enable signal circuit, and other circuit.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A pad driver circuit comprising:
    a pad node;
    a NMOS component;
    a feedback capacitor between the pad node and a gate of the NMOS component to control slew rate across a range of capacitor loads;
    a switch circuit between the pad node and the feedback capacitor; and
    a signal generator to generate a signal to control the switch circuit, and wherein the switch circuit to maintain a main driver circuit and a pre-driver circuit of the pad driver circuit in a non conduction state when an integrated circuit that includes the pad driver circuit is in a fail safe state.

2. The pad driver circuit of claim 1 further comprising:
    a PMOS component; and
    a bulk node signal generator to generate a bulk node signal to maintain bulk node of the PMOS component of the main driver circuit and bulk node of the PMOS component of the pre-driver circuit in a high potential to avoid possible forward bias current to flow from the pad node to an input of the pad driver circuit through the bulk node of the PMOS component of the main driver circuit and through the bulk node of the PMOS component of the pre-driver circuit.

3. The pad driver circuit of claim 2 further comprising an other feedback capacitor between a gate of the PMOS component and the pad node to control the slew rate across a range of capacitor loads.

4. The pad driver circuit of claim 3 wherein the capacitor load has a range of 10 pF to 400 pF.

5. The pad driver circuit of claim 2:
    wherein a control component coupled between the gate of the PMOS component and the pad node to maintain the PMOS component in the non conduction state to prevent flow of a pad node signal into a core of the integrated circuit through the input of the pad driver circuit when the integrated circuit that includes the pad driver circuit is in the fail safe state;

wherein the control component couples the pad node signal to a gate of the PMOS component to put the PMOS component in a non conductive state to avoid any current draw from the pad node; and wherein the control component is another PMOS component.

6. The pad driver circuit of claim 1 wherein the signal from the signal generator is low in a normal driver mode to permit the pre-driver circuit to function normally when the input to the pad driver circuit is high and when an enable signal to the signal generator is high.

7. The pad driver circuit of claim 1 wherein the signal from the signal generator is low in a normal receiver mode when the input to the pad driver circuit is high and when an enable signal to the signal generator is low.

8. The pad driver circuit of claim 1 wherein the signal from the signal generator is same as the pad node signal to prevent the pad node signal arriving at the input of the pad driver circuit through the pre-driver circuit in the fail safe state when an enable signal and the input to the signal generator is low.

9. A method of a pad driver circuit comprising:
controlling slew rate across a range of capacitor loads;
generating a signal to control a switch circuit to maintain a main driver circuit and a pre-driver circuit of the pad driver circuit in a fail safe state when an integrated circuit that includes the pad driver circuit is in the fail safe state; and
generating a bulk node signal to maintain a bulk node of a PMOS component of the main driver circuit and a bulk node of a PMOS component of the pre-driver circuit in high potential to avoid possible forward bias current to flow from a pad node to an input of the pad driver circuit in the fail safe state.

10. The method of the pad driver circuit of claim 9 further comprising controlling a slew rate across a range of capacitor loads through another feedback capacitor coupled between a gate of the PMOS component and the pad node.

11. The method of the pad driver circuit of claim 10 wherein the capacitor load has a range of 10 pF to 400 pF.

12. The method of the pad driver circuit of claim 9 further comprising:
preventing a flow of a pad node signal into a core of the integrated circuit through the input of the pad driver circuit using a control component when the integrated circuit that includes the pad driver circuit is in the fail safe state, and wherein the control component is another PMOS component; wherein the signal from a signal generator is low in a normal driver mode to permit the pre-driver circuit to function normally when the input to the pad driver circuit is high and when an enable signal to the signal generator is high.

13. The method of the pad driver circuit of claim 9 wherein the signal from the signal generator is low in a normal receiver mode when the input to the pad driver circuit is high and when an enable signal to the signal generator is low.

14. The method of the pad driver circuit of claim 9 wherein the signal from the signal generator is same as a pad node signal to prevent the pad node signal arriving at the input of the pad driver circuit through the pre-driver circuit in the fail safe state when an enable signal to the signal generator is low.

15. An integrated circuit comprising:
a main logic circuitry; and
a pad driver circuitry coupled to the main logic circuitry to prevent a flow of a pad node signal to an NMOS component of a main driver circuit and a pre-driver circuit of the pad driver circuit when the integrated circuit that includes the main driver circuit and the pre-driver circuit in a fail safe state through a generation of a signal which controls a switch circuit of the pad driver circuitry;
wherein the switch circuit to control a flow of the pad node signal from a pad node of the pad driver circuitry to a gate of the NMOS component of the pad driver circuitry.

16. The integrated circuit of claim 15:
wherein the switch circuit is located between the gate of the NMOS component and the pad node of the pad driver circuit, and
wherein the signal to control the switch circuit is generated by a signal generator based on an input to the pad driver circuitry and the pad node signal.

17. The integrated circuit of claim 15 further comprising a bulk node signal generator to generate a bulk node signal to maintain a PMOS component of the main driver circuit and a PMOS component of the pre-driver circuit in a non conductive state when the integrated circuit that includes the pad driver circuit is in the fail safe state.

18. An integrated circuit comprising:
a main logic circuitry;
a pad driver circuitry coupled to the main logic circuitry to prevent a flow of a pad node signal to an NMOS component of a main driver circuit and a pre-driver circuit of the pad driver circuit when the integrated circuit that includes the main driver circuit and the pre-driver circuit in a fail safe state through a generation of a signal which controls a switch circuit of the pad driver circuitry, wherein the switch circuit is located between the gate of the NMOS component and the pad node of the pad driver circuit, and
wherein the signal to control the switch circuit is generated by a signal generator based on an input to the pad driver circuitry and the pad node signal.

19. The integrated circuit of claim 18, wherein the switch circuit to control a flow of the pad node signal from a pad node of the pad driver circuitry to a gate of the NMOS component of the pad driver circuitry.

20. The integrated circuit of claim 18 further comprising a bulk node signal generator to generate a bulk node signal to maintain a PMOS component of the main driver circuit and a PMOS component of the pre-driver circuit in a non conductive state when the integrated circuit that includes the pad driver circuit is in the fail safe state.

21. An integrated circuit comprising:
a main logic circuitry;
a pad driver circuitry coupled to the main logic circuitry to prevent a flow of a pad node signal to an NMOS component of a main driver circuit and a pre-driver circuit of the pad driver circuit when the integrated circuit that includes the main driver circuit and the pre-driver circuit in a fail safe state through a generation of a signal which controls a switch circuit of the pad driver circuitry; and
a bulk node signal generator to generate a bulk node signal to maintain a PMOS component of the main driver circuit and a PMOS component of the pre-driver circuit in a non conductive state when the integrated circuit that includes the pad driver circuit is in the fail safe state.

22. The integrated circuit of claim 21 wherein the switch circuit to control a flow of the pad node signal from a pad node of the pad driver circuitry to a gate of the NMOS component of the pad driver circuitry.

23. The integrated circuit of claim 21:
wherein the switch circuit is located between the gate of the NMOS component and the pad node of the pad driver circuit, and
wherein the signal to control the switch circuit is generated by a signal generator based on an input to the pad driver circuitry and the pad node signal.

24. A method of a pad driver circuit comprising:
controlling slew rate across a range of capacitor loads;
generating a signal to control a switch circuit to maintain a main driver circuit and a pre-driver circuit of the pad driver circuit in a fail safe state when an integrated circuit that includes the pad driver circuit is in the fail safe state;
generating a bulk node signal to maintain a bulk node of a PMOS component of the main driver circuit and a bulk node of a PMOS component of the pre-driver circuit in high potential to avoid possible forward bias current to flow from a pad node to an input of the pad driver circuit in the fail safe state; and
preventing a flow of a pad node signal into a core of the integrated circuit through the input of the pad driver circuit using a control component when the integrated circuit that includes the pad driver circuit is in the fail safe state, and wherein the control component is another PMOS component.

25. The method of the pad driver circuit of claim 24 further comprising controlling a slew rate across a range of capacitor loads through another feedback capacitor coupled between a gate of the PMOS component and the pad node.

26. The method of the pad driver circuit of claim 25 wherein the capacitor load has a range of 10 pF to 400 pF.

27. The method of the pad driver circuit of claim 24 wherein the signal from a signal generator is low in a normal driver mode to permit the pre-driver circuit to function normally when the input to the pad driver circuit is high and when an enable signal to the signal generator is high.

28. The method of the pad driver circuit of claim 24 wherein the signal from the signal generator is low in a normal receiver mode when the input to the pad driver circuit is high and when an enable signal to the signal generator is low.

29. The method of the pad driver circuit of claim 24 wherein the signal from the signal generator is same as a pad node signal to prevent the pad node signal arriving at the input of the pad driver circuit through the pre-driver circuit in the fail safe state when an enable signal to the signal generator is low.

\* \* \* \* \*